(12) United States Patent
Ng et al.

(10) Patent No.: US 7,612,386 B2
(45) Date of Patent: Nov. 3, 2009

(54) HIGH POWER LIGHT EMITTING DIODE DEVICE

(75) Inventors: Kee Yean Ng, Penang (MY); Cheng Why Tan, Penang (MY); Ji Kin Tham, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 217 days.

(21) Appl. No.: 11/358,477

(22) Filed: Feb. 20, 2006

(65) Prior Publication Data

US 2006/0138645 A1    Jun. 29, 2006

Related U.S. Application Data

(62) Division of application No. 10/683,489, filed on Oct. 9, 2003, now abandoned.

(51) Int. Cl.
*H01L 33/00* (2006.01)
(52) U.S. Cl. .................. 257/99; 257/98; 257/100; 257/722; 257/730; 257/E51.02; 257/E33.075
(58) Field of Classification Search .................. 257/705, 257/706, 707, 98–100, 103, 712–713, 722, 257/730, 675, 666, 773, 784, 774, 786, 787, 257/E51.018, E51.02, E31.117, E23.116, 257/E33.075, E31.131, E23.051, E23.08, 257/E23.081
See application file for complete search history.

(56) References Cited

U.S. PATENT DOCUMENTS 5,910,686 A     6/1999    Hamzehdoost et al.
6,011,299 A *   1/2000    Brench ........................ 257/660
6,501,103 B1 * 12/2002   Jory et al. ..................... 257/100
6,717,494 B2    4/2004    Kikuchi et al.
6,720,651 B2    4/2004    Gaku
6,828,671 B2 * 12/2004   Aquien et al. ................ 257/706
6,864,513 B2 *  3/2005    Lin et al. ....................... 257/99
7,078,803 B2 *  7/2006    Tilton et al. .................. 257/714
2004/0136163 A1 7/2004    Horng et al.
2005/0073846 A1 4/2005    Takine

FOREIGN PATENT DOCUMENTS

JP              357155752          9/1989

* cited by examiner

*Primary Examiner*—Theresa T. Doan
*Assistant Examiner*—Dilinh Nguyen

(57) ABSTRACT

A circuit element having a heat-conducting body having top and bottom surfaces, and a die having an electronic circuit thereon is disclosed. The die includes first and second contact points for powering the electronic circuit. The die is in thermal contact with the heat-conducting body, the die having a bottom surface that is smaller than the top surface of the heat-conducting body. The first contact point on the die is connected to a first trace bonded to the top surface of the heat-conducting body. An encapsulating cap covers the die. The first trace has a first portion that extends outside of the encapsulating cap and a second portion that is covered by the encapsulating cap. The heat-conducting body is preferably constructed from copper or aluminum and includes a cavity having an opening on the first surface in which the die is mounted. The die preferably includes a light-emitting device.

13 Claims, 6 Drawing Sheets

FIGURE 3B
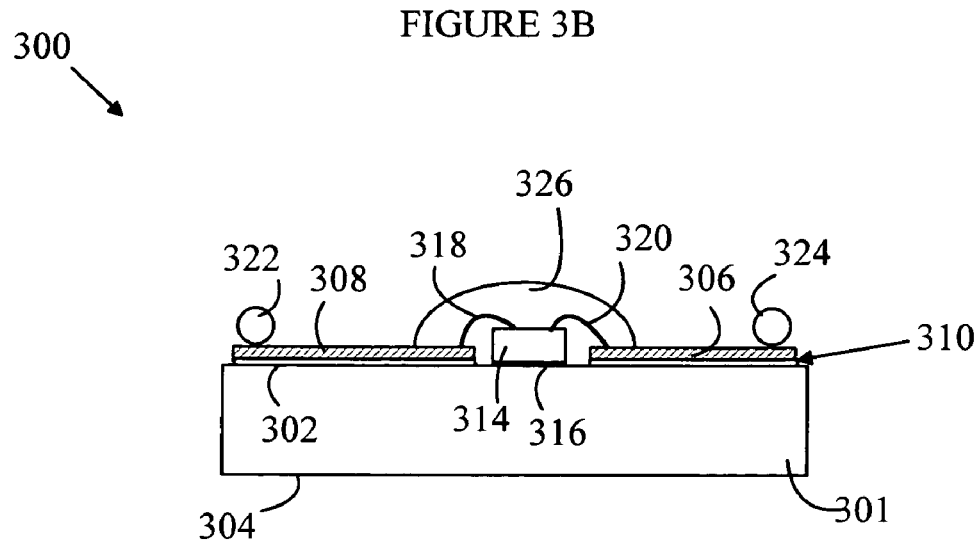
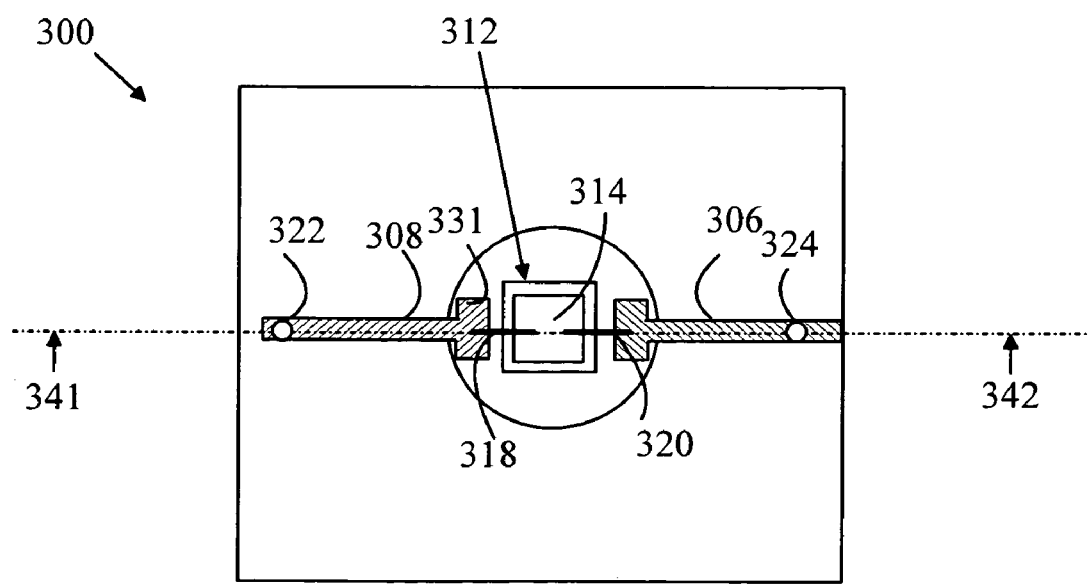
FIGURE 3A

FIGURE 3D
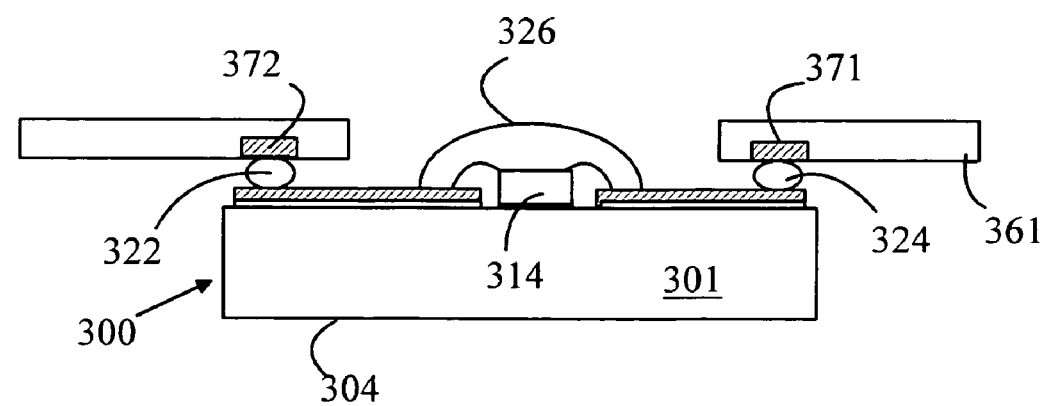
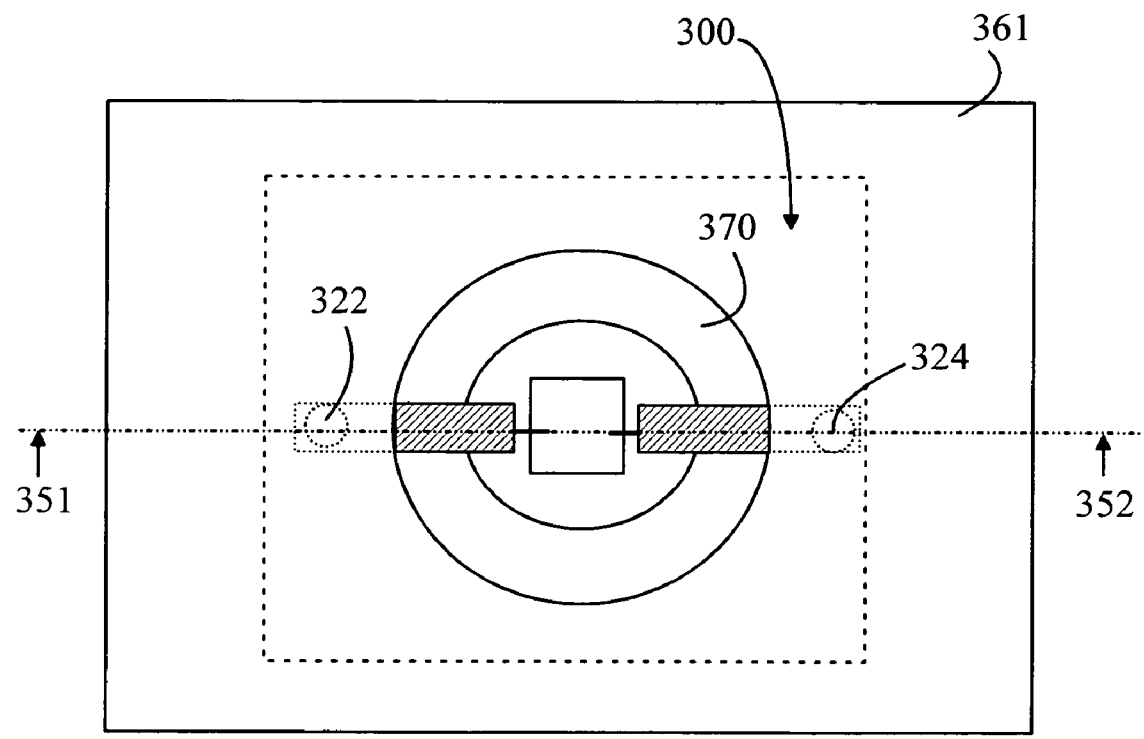
FIGURE 3C

US 7,612,386 B2

HIGH POWER LIGHT EMITTING DIODE DEVICE

RELATED APPLICATIONS

This application is a division of patent application Ser. No. 10/683,489, filing date Oct. 9, 2003 now abandoned.

BACKGROUND OF THE INVENTION

Light emitting diodes (LEDs) are fabricated from compound semiconductor materials, which have the characteristic of emitting light when biased with a forward current. LEDs are widely used as indicators or displays in various types of appliances. Historically, LEDs emitted a relatively low level of light compared to other light sources and were suitable for indoor applications only.

Recent advances in compound semiconductor materials research have yielded new LEDs, which emit very high levels of light. Examples of these new LED materials are Aluminum Indium Gallium Phosphide (AlInGaP) and Indium Gallium Nitride (InGaN). These high brightness LEDs have given rise to new LED devices suitable for applications in areas such as outdoor video displays, automotive signals, traffic signals and illumination.

The high output achieved with these devices is the result of efficient semiconductor materials and of driving the LEDs at very high forward currents. Drive currents in the hundreds or thousands of milliamperes (mA) are often utilized. Unfortunately, such high drive currents produce excessive heat. Since the efficiency of an LED decreases at these high temperatures, light output starts to drop. In addition, the packaging of the devices starts to break down due to prolonged exposure to the elevated temperatures. Such packaging failures limit useful life of the device. A number of device packages have been proposed; however, none of these provide sufficient heat dissipation for the current generation of high-power LEDs.

SUMMARY OF THE INVENTION

The present invention includes a circuit element having a heat-conducting body having top and bottom surfaces, and a die having an electronic circuit thereon. The die includes first and second contact points for powering the electronic circuit. The die is in thermal contact with the heat-conducting body, the die having a bottom surface that is smaller than the top surface of the heat-conducting body. A first trace constructed from an electrically conducting material bonded to the top surface of the heat-conducting body and electrically insulated therefrom is connected to the first contact point by an electrically conducting path that is preferably a wire bond. An encapsulating cap covers the die and the first electrically conducting path. The first trace has a first portion that extends outside of the encapsulating cap and a second portion that is covered by the encapsulating cap. The heat-conducting body is preferably constructed from copper or aluminum and includes a cavity having an opening on the first surface in which the die is mounted. The die preferably includes a light-emitting device that emits light in a direction pointing away from the top surface, the encapsulating cap being optically transparent to the emitted light. The encapsulating cap can include a dam surrounding the die, the dam is filled with a clear encapsulating material.

The first trace preferably includes a solder ball on the first portion thereof. The circuit element may include a second trace for making the connection to the second contact point on the die. Alternatively, the second connection can be made through the heat-conducting die itself. A second solder ball is preferably placed on the second trace or the heat-conducting body to provide an electrical connection to the second contact point of the die. A third solder ball is preferably provided on the top surface of the heat conducting body at a location that is non-colinear with the first and second solder balls. The solder balls provide a mechanism for coupling the circuit element to a printed circuit board as well as providing power to the die. To further facilitate heat transfer from the heat-conducting body, the bottom surface of the heat conducting body may include fins or other features for increasing the surface area of the bottom surface relative to the top surface of the heat conducting body.

BRIEF DESCRIPTION OF THE DRAWINGS

FIG. 3A is a top view of an LED device.

FIG. 3B is a cross-sectional view through line 341-342 of LED device shown in FIG. 3A.

FIG. 3C is a top view of substrate 361 that illustrates the manner in which an LED device is mounted on a substrate such as a PCB.

FIG. 3D is a cross-sectional view through line 351-352 of the LED device shown in FIG. 3C.

DETAILED DESCRIPTION OF THE PREFERRED EMBODIMENTS OF THE INVENTION

Figure 1:
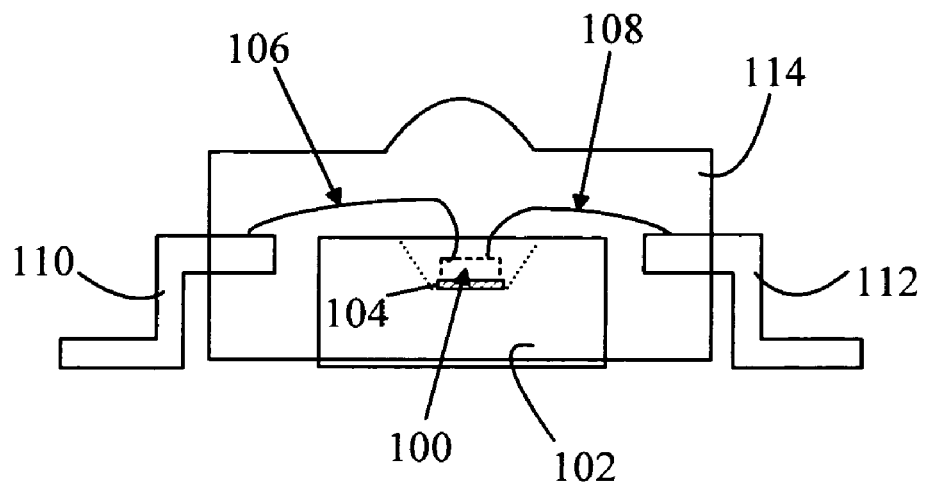
FIG. 1 is a cross-sectional view of a packaged LED according to one prior art design.
Figure 2:
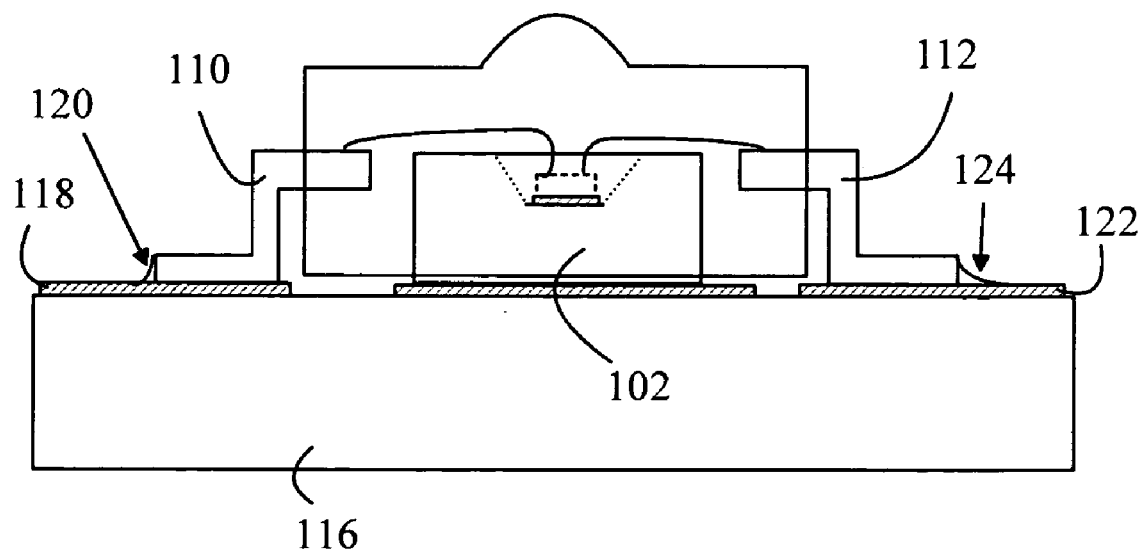
FIG. 2 is a cross-sectional view of the packaged LED shown in FIG. 1 attached to a typical printed circuit board (PCB).

The manner in which the present invention provides its advantages can be more easily understood with reference to FIGS. 1 and 2, which illustrate the manner in which one class of prior art LED provides heat dissipation. Refer now to FIG. 1, which is cross-sectional view of a packaged LED according to one prior art design. An LED 100 is mounted in a cavity of a substrate 102 using a conductive medium 104. A first bond wire 106 electrically connects one terminal of the LED 100 to one electrical contact 110 while a second bond wire 108 electrically connects a second terminal of LED 100 to another electrical contact 112. An encapsulating body 114 substantially encases the LED, the bond wires, the substrate and the contacts to provide protection for the LED.

Refer now to FIG. 2, which is a cross-sectional view of the packaged LED shown in FIG. 1 attached to a typical printed circuit board (PCB) 116. The base of substrate 102 is mounted on a PCB 116 so that it is in direct contact with PCB 116. One electrical contact 110 is electrically connected to the trace 118 of the PCB via an electrically conductive medium 120 while the other electrical contact 112 is electrically connected to trace 122 of the PCB via an electrically conductive medium 124. Typically, solder is used for these connections. The heat generated in LED 100 is conducted to the PCB through substrate 102.

The LED device in FIG. 1 has many disadvantages. For instance, the ability of substrate 102 to act as a heat sink and heat transfer conduit depends on the size of the substrate. Since the electrical contacts at the sides of the substrate increase the footprint of the device without providing additional surface area for heat conduction, these devices cannot incorporate heat sinks as large as the footprint of the device. That is, the lateral size of the heat sink will always be smaller than the overall footprint of the device. Furthermore, there is a limit to how tall or thick the substrate can be without having to increase device design complexity. Hence, the ability of the substrate to act as a heat sink for temporarily absorbing heat from the LED is limited.

Prior art devices attempt to overcome the limitations of the substrate size by relying on a secondary heat sink in the form of the PCB 116 to help conduct the heat away from the LED, and hence, limit the temperature rise to which the LED is subjected. This solution moves the heat dissipation problem to the PCB. To provide adequate heat conduction and sinking, a metal core PCB with some provision for transferring the heat to the surrounding air is often needed. Since the cost of such metal core PCBs is significantly greater than the cost of the more common glass epoxy PCBs, this solution significantly increases the cost of the final circuit utilizing the LED. In addition, this solution increases the design complexity of the final PCB since the PCB must be arranged to dissipate the heat without subjecting other components on the PCB to excessive temperatures.

In addition, these prior art solutions require a good contact between the PCB and substrate 102. The coplanarity among the leads 110 & 112 and the substrate 102 can make achieving adequate thermal contact difficult. Even if a layer of thermal glue is used to ensure good contact, air gaps or voids may still exist in between the device and the mounting PCB. Furthermore, such thermal glue layers can also restrict the flow of heat. Finally, the thermal glue further increases the cost and complexity of the assembly of the final PCB.

The present invention provides a high power LED device, which has sufficient heat sinking capability to absorb fluctuations in the heat output of the LED. In addition, the present invention dissipates heat without relying on secondary heat sinks. Refer now to FIGS. 3A-D, which illustrate an LED device 300 according to one embodiment of the present invention. FIG. 3A is a top view of an LED device 300, and FIG. 3B is a cross-sectional view through line 341-342 shown in FIG. 3A. LED device 300 has a body 301 with a first surface 302 and a second surface 304 on the opposite side. A circuit trace having electrical contacts 306 and 308 on a thin film layer 310 is attached to surface 302. The circuit layer has an opening 312 in the center that provides access to surface 302. An LED 314 is attached to surface 302 using an adhesive 316. Electrical connections by way of bond wires 318 and 320 connect the LED to the electrical contacts 306 and 308. Solder bumps 322 and 324 are then deposited on one portion of the electrical contacts 306 and 308. The LED and bond wires and a portion of the electrical contacts are encapsulated in an optically clear material 326.

To facilitate the wire bonding operation, traces 306 and 308 preferably include a T-shaped region as shown at 331 in FIG. 3A. This enlarged area reduces the precision required in the wire bonding process.

Refer now to FIGS. 3C and 3D, which illustrate the manner in which LED device 300 is mounted on a substrate 361 such as a PCB. FIG. 3C is a top view of substrate 361, and FIG. 3D is a cross-sectional view through line 351-352. Substrate 361 includes an opening 370 through which LED 314 is viewed. Substrate 361 also includes two traces shown at 371 and 372, which are positioned to connect to solder bumps 322 and 324.

LED device 300 is connected to substrate 361 via traces 371 and 372 by any of a number of methods. For example, heat can be applied to substrate 361 sufficient to cause the solder to reflow and make the connections between LED device 300 and substrate 361. In another example, the solder can be deposited on the PCB before the placement of device 300, and the assembly subsequently reflowed. Additionally, an electrically conductive adhesive such as epoxy, silicone or suitable plastic can be used to make the attachment. Such adhesive can be either cured by heat or other means, such as exposure to ultraviolet (UV) light.

Body 301 provides two functions. First, body 301 acts as a heat sink that buffers thermal fluctuations. Surface 304 dissipates heat to the surrounding air. Body 301 is preferably made of a metal such as copper or aluminum to provide a high thermal conductivity. Since surface 304 is as large as the footprint of the device, this embodiment of the present invention provides substantially more heat transfer area than the prior art devices discussed above.

Figure 4:
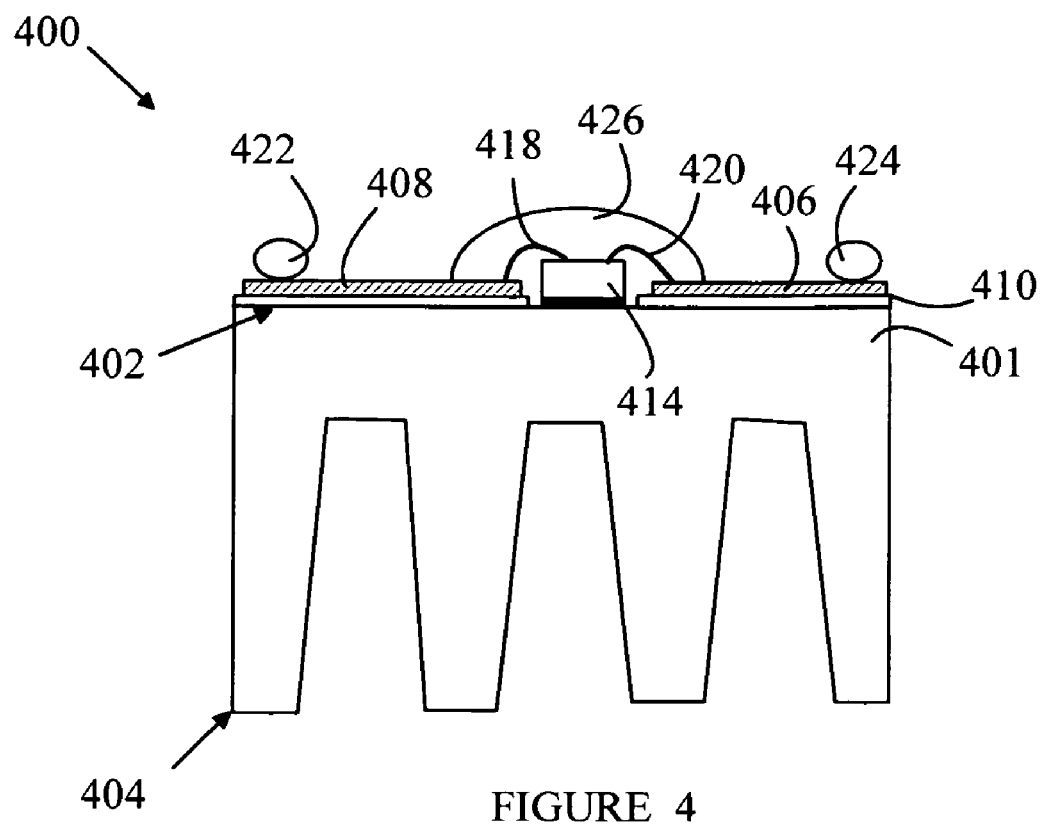
FIG. 4 is a cross-sectional view of an LED device with a greater surface area according to another embodiment of the present invention.

It should be noted that the heat transfer capability of the present invention can be enhanced by including a surface having a greater surface area in place of surface 304. Such an embodiment is shown in FIG. 4, which is a cross-sectional view of an LED device 400 according to another embodiment of the present invention. In construction, LED device 400 is similar to LED device 300 discussed above except for the second surface of the device body. LED device 400 has a body 401 with a first surface 402 and a second surface 404 on the opposite side. A circuit trace consisting of electrical contacts 406 and 408 on a thin film layer 410 is attached to the said first surface of the body. The circuit layer has an opening in the center to provide access to surface 402. An LED 414 is attached to surface 402 using an adhesive layer. Electrical connections by way of bond wires 418 and 420 connect the LED to the electrical contacts 406 and 408. Solder bumps 422 and 424 are then deposited on one portion of the electrical contacts 406 and 408. The LED and bond wires and a portion of the electrical contacts are encapsulated with an optically clear material 426. Instead of a planar profile, the surface 404 has a fin-like, rib-like or stub-like shape to enhance heat dissipation. In effect, body 401 is a heat sink. The fin can be advantageously designed into any shape such as taper, rectangular, stubs etc. The fins can be molded as part of a single body as shown in the drawing or attached to surface 404 discussed above by any mechanism that provides good heat conduction.

Figure 5:
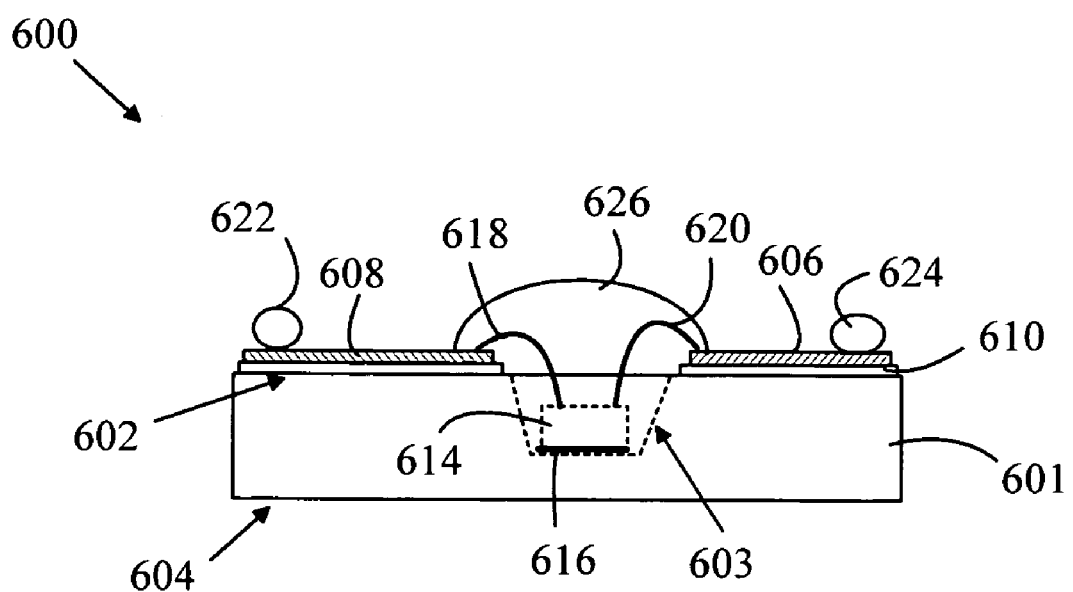
FIG. 5 is a cross-sectional view of an LED device that provides a reflector according to another embodiment of the present invention.

The above-described embodiments utilize a body having a flat surface such as surface 302 on which the LED is mounted. However, the present invention can be implemented by using a body that includes a cavity having reflective sides that improve light extraction from the LED by reflecting light leaving the sides of the LED such that the reflected light becomes part of the output light from the device. Refer now to FIG. 5, which is a cross-sectional view of an LED device 600 that provides such a reflector. In construction, LED device 600 is similar to LED device 300 discussed above except that a recess cavity is provided in the first surface 602. LED device 600 includes a body 601 having a first surface 602 and a second surface 604 on the opposite side. A circuit trace consisting of electrical contacts 606 and 608 on a thin film layer 610 is attached to surface 602. The circuit layer has an opening in the center to provide access to surface 602. An LED 614 is attached to the first surface 602 inside a cavity 603 using an adhesive 616. Electrical connections by way of bond wires 618 and 620 connect the LED to the electrical contacts 606 and 608. Solder bumps 622 and 624 are then deposited on one portion of the electrical contacts 606 and 608. The LED and bond wires and a portion of the electrical contacts are encapsulated in an optically clear material 626.

Figure 6B:
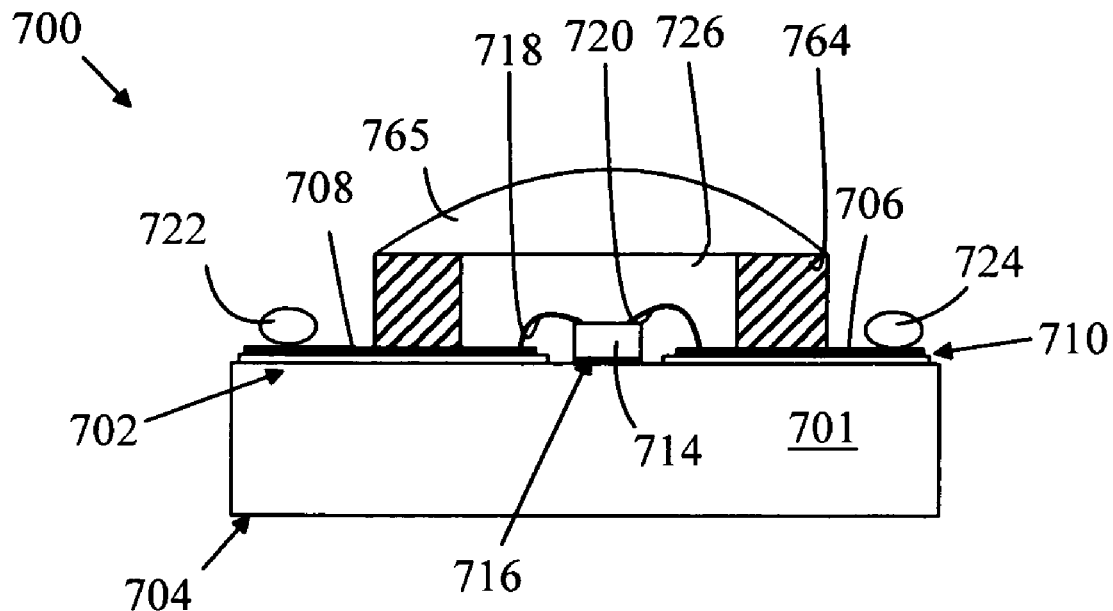
FIG. 6B is a cross-sectional view of the LED device shown in FIG. 6A through line 751-752.
Figure 6A:
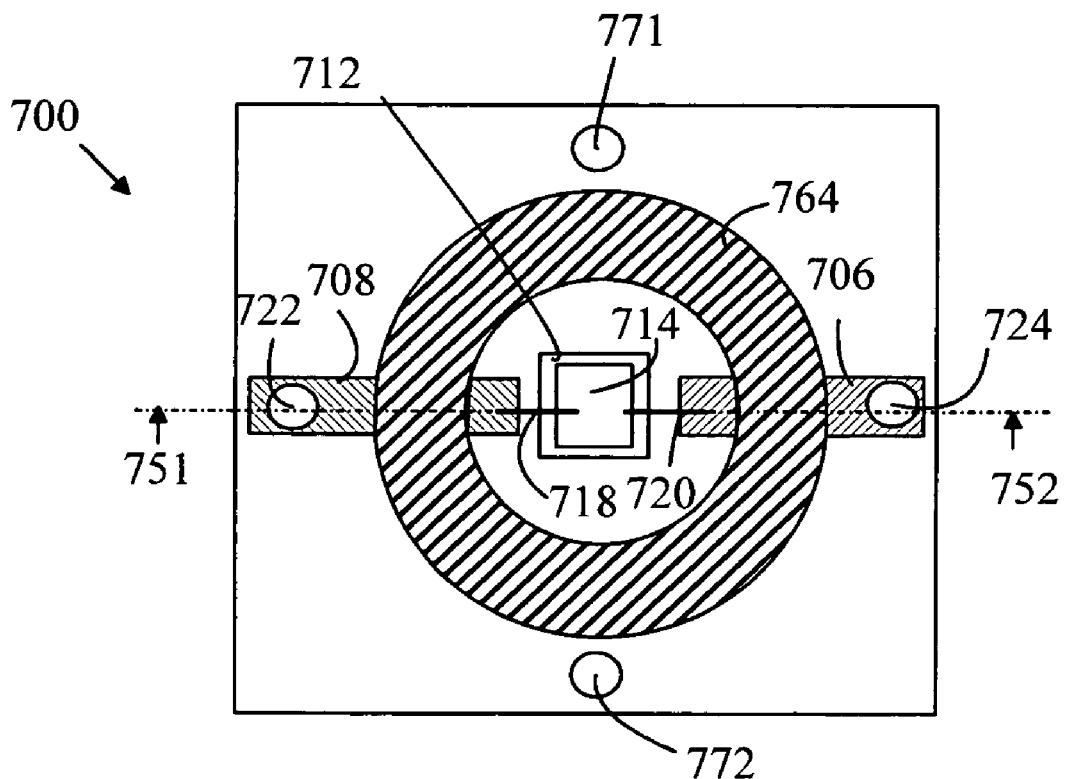
FIG. 6A is a top view of an LED device.

The above-described embodiments of the present invention utilize an encapsulating layer to protect the LED and bond wires. Embodiments that utilize a mold ring to aid in this encapsulating process can also be incorporated. Refer now to FIGS. 6A and 6B, which illustrate an LED device 700 according to another embodiment of the present invention. FIG. 6A is a top view of LED device 700, and FIG. 6B is a cross-sectional view of LED device 700 through line 751-752. In construction, LED device 700 is similar to LED device 300 discussed above except that an annular ring 764 is provided on the first surface 702. LED device 700 has a body 701 having a first surface 702 and a second surface 704 on the opposite side. An annular shaped ring 764 is attached on the first surface 702 by any known method such as using a thermally conductive adhesive, solder or just mechanically attached with fasteners. A circuit trace consisting of electrical contacts 706 and 708 on a thin film layer 710 is attached to surface 702. The circuit layer has an opening 712 in the center thereof to provide access to surface 702. An LED 714 is attached to surface 702 using an adhesive 716. Electrical connections by way of bond wires 718 and 720 connect the LED to the electrical contacts 706 and 708. Solder bumps 722 and 724 are then deposited on one portion of the electrical contacts 706 and 708. The LED and bond wires, and a portion of the electrical contacts, are encapsulated with optically clear material 726 by filling the cavity created by annular ring 764.

The annular-shaped ring 764 can be of any shape such as circular or polygonal. It acts as a reservoir to contain the optically clear encapsulant 726. Additionally, an optically clear lens 765 made of plastic, polymer or glass can be incorporated on top of the annular-shaped body so as to direct the light in a desired direction. The lens can be glued to the surface of the encapsulant or formed in the encapsulant by a molding operation.

It should be noted that surface 702 may include additional solder bumps to provide additional adhesion points for connecting the LED device to a PCB or the like. Such solder bumps are shown at 771 and 772 in FIG. 6A. These solder bumps may be formed on a conducting trace that is attached to surface 702 by an appropriate adhesive or directly on surface 702 if the metal chosen for body 701 is wet by solder. In this regard, copper is the preferred material for body 701.

The above-described embodiments utilize bond wires to make all of the connections between the LED and the solder bumps that connect to the PCB. However, the body may be used for one of these connections. If the chip is conductive or the bottom of the chip having the LED has a contact thereon, and the chip is mounted to the body by an electrically conducting adhesive, then the body can be used to connect to that contact. In this case, an appropriately placed solder bump is formed directly on surface 702.

The above-described embodiments utilize passive convection/conduction to move the heat from the bottom surface of the body, e.g., surface 704 or surface 404, to the surrounding air. However, embodiments in which a fan is utilized to enhance the airflow can also be constructed. The fan can be attached to the bottom surface of the body or provided in the enclosure in which the LED device is located.

From the forgoing discussion, it is clear that an LED device according to the present invention has the body, which spans the device footprint. Therefore the LED device has a heat sink that utilizes the full footprint of the device. Additionally, the body is not encased in any kind of thermally insulative encapsulant, and therefore, is able to dissipate heat more efficiently. Further, the problems related to the coplanarity of the leads and the heat sink in prior art devices have been overcome.

The bottom surface of the body is exposed to the ambient, and hence, efficient heat dissipation can be obtained. Additionally, since the bottom surface does not come in contact with any other surface, the body can be fabricated such that this surface extends as long or deep as possible. Hence, it is now possible to fabricate devices with long or deep heat sinks without having to increase the lateral dimensions of the devices.

Furthermore, since an LED device according to the present invention does not need to conduct heat to the mounting substrate, the mounting substrate can be constructed from common materials such as those used in inexpensive PCBs. In addition, the end-user does not need to provide an additional heat sink, thus simplifying the design of products that use the LED device.

Figure 7:
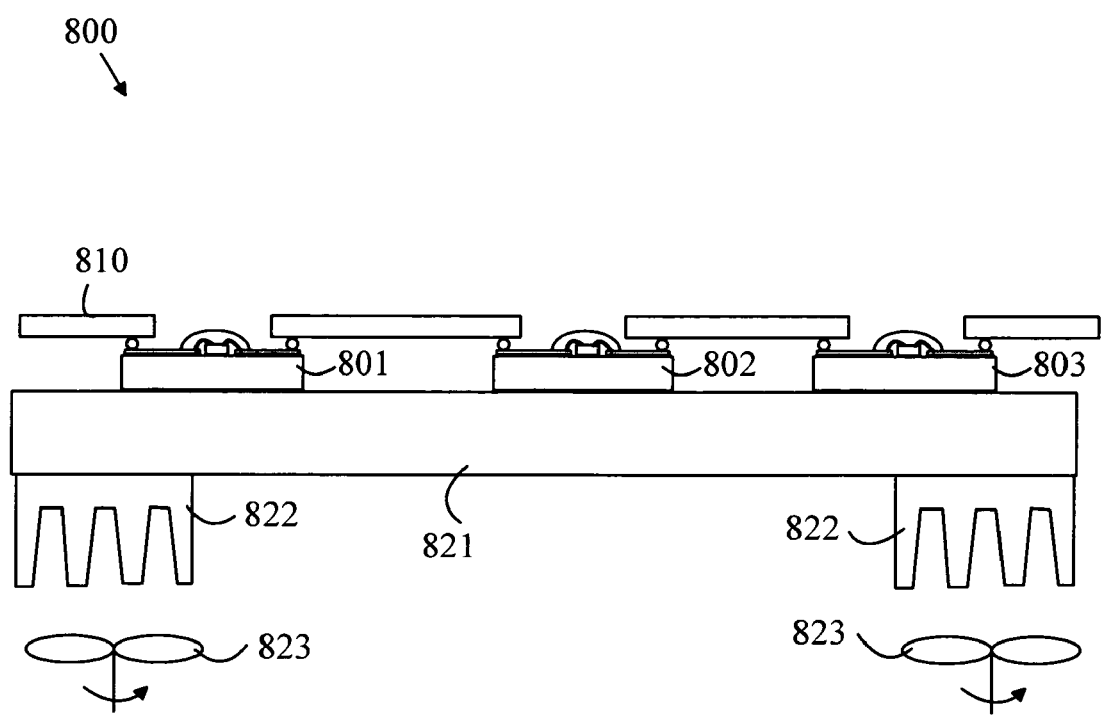
FIG. 7 is a cross-sectional view of an array of LED devices that share a single heat sink according to another embodiment of the present invention.

The above-described embodiments of the present invention have been described in terms of transferring the heat generated by the LED to the air via contact between the air and the second surface of the body on which the LED is mounted. However, the present invention can be utilized to construct products having a number of LEDs on a single PCB which transfer the heat generated in each of the LEDs to a common heat sink that dissipates the heat. Refer now to FIG. 7, which is a cross-sectional view of an array 800 of LED devices that share a single heat sink according to another embodiment of the present invention. Array 800 is constructed on a PCB 810. A plurality of LED devices according to the present invention is mounted on PCB 810 in a manner analogous to that described above. Exemplary LED devices are shown at 801-803. The body of each of the LED devices is in thermal contact with a common heat sink 821. For example, the individual LED devices can be connected to heat sink 821 by a layer of heat conducting adhesive. Heat sink 821 may also include structures, such as the fins shown at 822 to facilitate the transfer of heat to the surrounding air. Heat sink 821 can also include a fan 823 to further enhance the transfer of heat from heat sink 821 to the surrounding air.

In the above-described embodiments, the die is mounted on a heat-conducting body that is preferably made from Aluminum or Copper. However, other materials such as ceramics and composites may be utilized for the heat-conducting body.

Various modifications to the present invention will become apparent to those skilled in the art from the foregoing description and accompanying drawings. Accordingly, the present invention is to be limited solely by the scope of the following claims.

What is claimed is:

1. A light-emitting diode (LED) package, comprising:
 a thermally-conductive heat-sinking body comprising first and second opposing surfaces, the first and second surfaces having first and second surface areas, respectively, the second surface area exceeding the first surface area;
 an LED device comprising a bottom surface, a light-emitting element, a first contact point, and a second contact point, the first and second contact points being configured to provide electrical current to the LED device, the bottom surface being attached to the first surface and thermally connected thereto;
 a first electrical trace comprising an electrically conductive material disposed on the first surface and electrically insulated therefrom, the first trace comprising a first proximal end and a first distal end;

a second electrical trace comprising an electrically conductive material disposed on the first surface and electrically insulated therefrom, the second trace comprising a second proximal end and a second distal end;

a first electrically conductive path connecting the first contact point and the first proximal end;

a second electrically conductive oath connecting the second contact point and the second proximal end;

an optically transparent encapsulating cap disposed over the LED device and encapsulating same, the encapsulating cap further covering at least the first proximal end, the second proximal end, the first electrical contact, and the second electrical contact, and a circuit board having top and bottom surfaces and a hole disposed therethrough;

wherein the LED package is electrically coupled to the printed circuit board, the first and second distal ends of the first and second traces are electrically connected to corresponding first and second electrical conductors disposed on the printed circuit board, at least portions of the LED device are aligned with the hole and visible therethrough, at least portions of the LED package are coupled to the bottom surface of the printed circuit board, at least portions of the first surface of the heat sinking body are located adjacent to the bottom surface of the printed circuit board, and the second surface of the heat sinking body is not in contact with the bottom surface of the printed circuit board.

2. The LED package of claim 1, wherein the second surface of the thermally-conductive heat-sinking body further comprises at least one of fins, rib-like elements and stub-shaped elements, such fins or elements being configured to facilitate the transfer of heat away from the second surface.

3. The LED package of claim 1, wherein portions of the thermally-conductive heat-sinking body are attached to the printed circuit board.

4. The LED package of claim 1, wherein the first and second distal ends of the first and second traces are connected to the first and second electrical conductors by at least one of solder joints and electrically-conductive adhesive.

5. The LED package of claim 1, wherein the thermally-conductive heat-sinking body is formed of a material comprising at least one of aluminum, copper, ceramic and a composite.

6. The LED package of claim 1, wherein the LED package further comprises a fan operatively associated with the thermally-conductive heat-sinking body to facilitate the transfer of heat away from the body.

7. The LED package of claim 1, wherein a plurality of LED devices are attached to the first surface and thermally connected thereto.

8. The LED package of claim 1, wherein a mold ring surrounds the LED device and the encapsulating cap is disposed therewithin.

9. The LED package of claim 8, wherein the mold ring is an annular ring.

10. The LED package of claim 8, wherein an optically transparent lens is attached to the mold ring over the LED device.

11. The LED package of claim 1, wherein the bottom surface of the LED device is attached to the first surface by an adhesive.

12. The LED package of claim 1, wherein the first and second electrically conductive paths comprise bond wires.

13. The LED package of claim 1, wherein the first surface has a cavity comprising sidewalls disposed therewithin, the cavity being configured to receive the LED device therein and reflect light emitted from the LED from the sidewalls thereof.

* * * * *